(12) United States Patent
Truett

(10) Patent No.: US 6,639,412 B1
(45) Date of Patent: Oct. 28, 2003

(54) COAXIAL CABLE VOLTAGE TEST INDICATOR

(76) Inventor: Michael Lane Truett, 56 Satellite Hill Dr., Marion, NC (US) 28752

( * ) Notice: Subject to any disclaimer, the term of this patent is extended or adjusted under 35 U.S.C. 154(b) by 17 days.

(21) Appl. No.: 10/044,751

(22) Filed: Jan. 14, 2002

(51) Int. Cl.[7] ............................................. G01R 31/02

(52) U.S. Cl. ...................................... 324/542; 324/538

(58) Field of Search ................................ 324/538, 539, 324/540, 541, 542, 543; 439/135, 137, 146, 151

(56) References Cited

U.S. PATENT DOCUMENTS

| | | | | |
|---|---|---|---|---|
| 4,399,400 A | * | 8/1983 | Rockwell et al. | 324/540 |
| 4,803,459 A | * | 2/1989 | Ta | 340/459 |
| 5,250,908 A | * | 10/1993 | Liu et al. | 324/542 |
| 6,344,748 B1 | * | 2/2002 | Gannon | 324/542 |

* cited by examiner

Primary Examiner—N. Le
Assistant Examiner—Vincent Q. Nguyen

(57) ABSTRACT

The present invention has a coaxial cable connection electrically connected to a voltage monitor circuit for discriminating between multiple voltage levels. A visual display is electrically connected to the voltage monitor circuit and which displays the measured voltage level. The entire circuit is powered from the input on the coaxial cable connection.

5 Claims, 2 Drawing Sheets

COAXIAL CABLE VOLTAGE TEST INDICATOR

BACKGROUND OF THE INVENTION

1. Field of the Invention

The present invention relates to a coaxial cable voltage test indicator for use in connection with testing satellite systems. The coaxial cable voltage test indicator has particular utility in connection with voltage testing satellite low noise block down-converter cables.

2. Description of the Prior Art

Coaxial cable voltage test indicators are desirable for determining the polarity and voltage level of signals from the satellite receiver to the low noise block down-converter to insure that it is functioning correctly and to insure that the cable is transmitting signal.

The use of testing satellite systems is known in the prior art. U.S. Pat. No. 6,208,296 to Saib discloses a method and apparatus for broadcast satellite that has a central low noise block down-converter and four other down-converters surrounding it to measure the variance in signal strength to help to train the position of the antenna. However, the Saib '296 patent does not show a voltage test indicator of the receiver to insure proper functioning, nor does it function under the power of the receiver output.

Similarly, U.S. Pat. No. 4,977,579 to Bateman discloses a test set for a navigational satellite receiver that has a digital card tester section and a satellite simulator section that is used to detected the reduced capabilities of a navigational satellite receiver and to troubleshoot the malfunction. However, the Bateman '579 patent does not show a voltage test indicator of the receiver to insure proper functioning, nor does it function under the power of the receiver output.

Lastly, U.S. Pat. No. 6,038,427 to Hsu et al discloses a method and apparatus for measuring group delay for satellite communications that measures a quasi-real time phase reference due to movement of the satellite with respect to the earth during group delay measurement may be removed. However, the Hsu et al '427 patent does not show a voltage test indicator of the receiver to insure proper functioning, nor does it function under the power of the receiver output.

While the above-described devices fulfill their respective, particular objectives and requirements, the aforementioned patents do not describe a coaxial cable voltage test indicator that allows voltage testing satellite low noise block down-converter cables. The Saib '296, Bateman '579, and Hsu et al '427 patents makes no provision for showing a voltage test indicator of the receiver to insure proper functioning, nor do they function under the power of the receiver output.

Therefore, a need exists for a new and improved coaxial cable voltage test indicator that can be used for voltage testing satellite low noise block down-converter cables. In this regard, the present invention substantially fulfills this need. In this respect, the coaxial cable voltage test indicator according to the present invention substantially departs from the conventional concepts and designs of the prior art, and in doing so provides an apparatus primarily developed for the purpose of voltage testing satellite low noise block down-converter cables.

SUMMARY OF THE INVENTION

In view of the foregoing disadvantages inherent in the known types of testing satellite systems now present in the prior art, the present invention provides an improved coaxial cable voltage test indicator, and overcomes the above-mentioned disadvantages and drawbacks of the prior art. As such, the general purpose of the present invention, which will be described subsequently in greater detail, is to provide a new and improved coaxial cable voltage test indicator and method which has all the advantages of the prior art mentioned heretofore and many novel features that result in a coaxial cable voltage test indicator which is not anticipated, rendered obvious, suggested, or even implied by the prior art, either alone or in any combination thereof.

To attain this, the present invention essentially comprises a coaxial cable connection electrically connected to a voltage monitor circuit for discriminating between multiple voltage levels. A visual display is electrically connected to the voltage monitor circuit and which displays the measured voltage level. The entire circuit is powered from the input on the coaxial cable connection.

There has thus been outlined, rather broadly, the more important features of the invention in order that the detailed description thereof that follows may be better understood and in order that the present contribution to the art may be better appreciated.

The invention may also include a voltage divider to set the high and low voltage set points. The invention may also have a five volt voltage regulator to supply constant voltage to a voltage divider. The invention may also have an amplifier for driving LEDs and a green LED to delimit 13 VDC and a red LED to delimit 18 VDC, and a parallel capacitor to ground from the coaxial cable connection. There are, of course, additional features of the invention that will be described hereinafter and which will form the subject matter of the claims attached.

Numerous objects, features and advantages of the present invention will be readily apparent to those of ordinary skill in the art upon a reading of the following detailed description of presently preferred, but nonetheless illustrative, embodiments of the present invention when taken in conjunction with the accompanying drawings. In this respect, before explaining the current embodiment of the invention in detail. It is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of descriptions and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore an object of the present invention to provide a new and improved coaxial cable voltage test indicator that has all of the advantages of the prior art testing satellite systems and none of the disadvantages.

It is another object of the present invention to provide a new and improved coaxial cable voltage test indicator that may be easily and efficiently manufactured and marketed.

An even further object of the present invention is to provide a new and improved coaxial cable voltage test indicator that has a low cost of manufacture with regard to both materials and labor, and which accordingly is then susceptible of low prices of sale to the consuming public. thereby making such coaxial cable voltage test indicator economically available to the buying public.

Still another object of the present invention is to provide a new coaxial cable voltage test indicator that provides in the apparatuses and methods of the prior art some of the advantages thereof, while simultaneously overcoming some of the disadvantages normally associated therewith.

Even still another object of the present invention is to provide a coaxial cable voltage test indicator for allowing average consumers to affordably install their own digital satellite service equipment.

Yet, even still another object of the present invention is to provide a coaxial cable voltage test indicator for testing whether a satellite receiver is outputting the proper direct current voltage.

Further, another object of the present invention is to provide a coaxial cable voltage test indicator for testing the cable to the low noise block down-converter for proper voltage.

Further still another object of the present invention is to provide a coaxial cable voltage test indicator for testing the cable and intermediate frequency amplifiers between the satellite receiver and the low noise block down-converter for proper functioning.

Yet further still another object of the present invention is to provide a coaxial cable voltage test indicator for testing mast mounted VHF/UHF TV pre-amplifiers which use the center conductor of a coaxial cable as the means of power delivery to the pre-amplifier.

Lastly, it is an object of the present invention is to provide a coaxial cable voltage test indicator for allowing average consumers to affordably maintain their own digital satellite service equipment.

These together with other objects of the invention, along with the various features of novelty that characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description make reference to the annexed drawings wherein.

The same reference numerals refer to the same parts throughout the various figures.

DESCRIPTION OF THE PREFERRED EMBODIMENT

Figure 1:
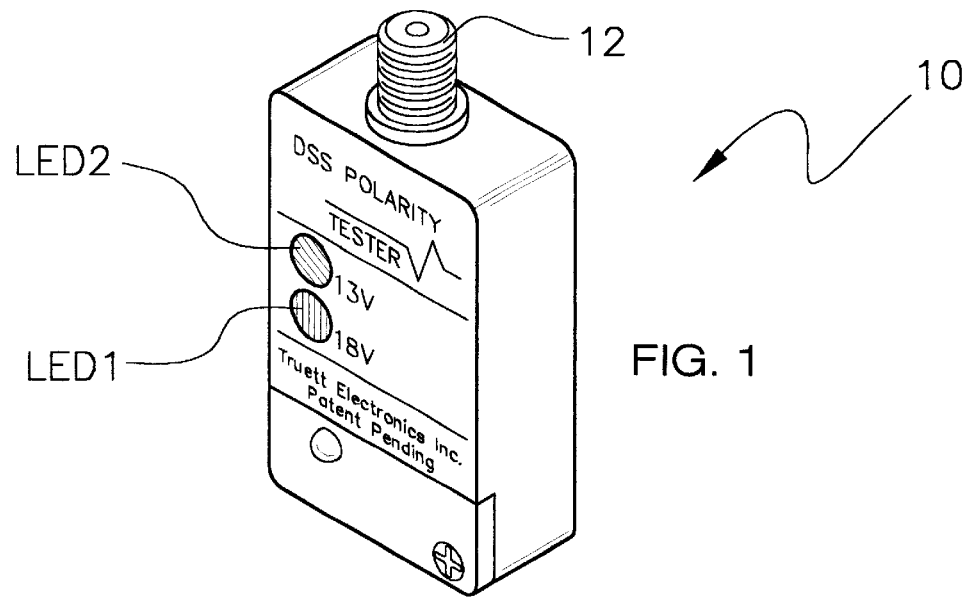
FIG. 1 is a front perspective view of the preferred embodiment of the coaxial cable voltage test indicator constructed in accordance with the principles of the present invention.
Figure 2:
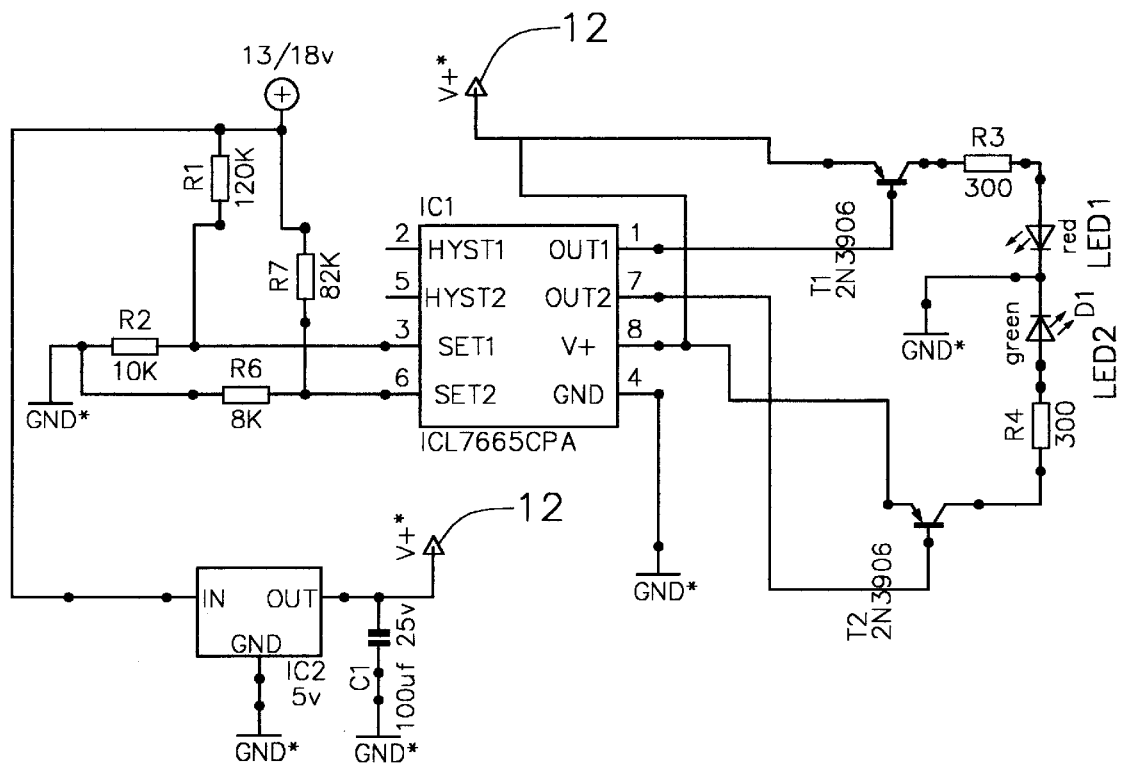
FIG. 2 is a schematic view of the coaxial cable voltage test indicator of the present invention.
Figure 3:
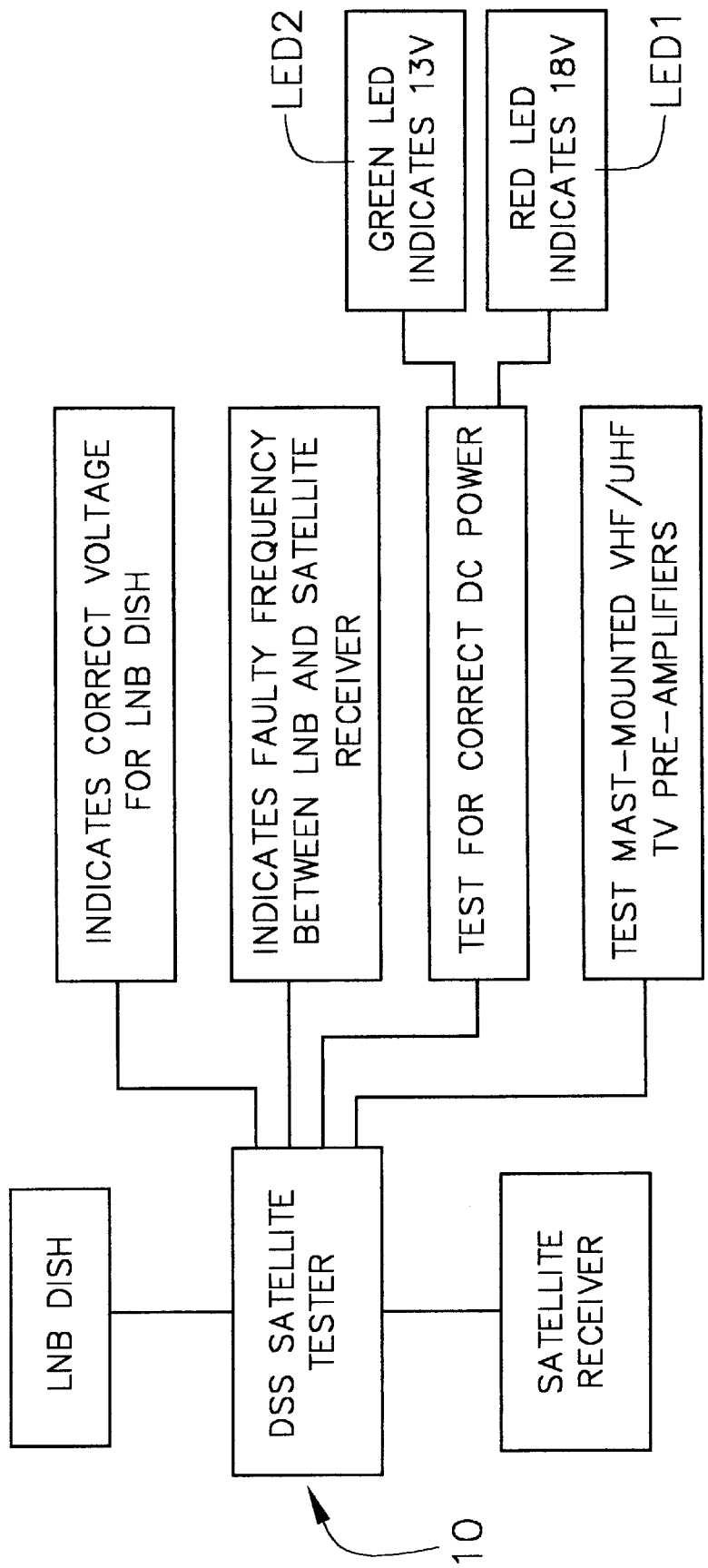
FIG. 3 is a logic block view of the coaxial cable voltage test indicator of the present invention.

Referring now to the drawings, and particularly to FIGS. 1–3, a preferred embodiment of the coaxial cable voltage test indicator of the present invention is shown and generally designated by the reference numeral 10.

In FIG. 1, a new and improved coaxial cable voltage test indicator 10 of the present invention for testing the voltage levels on a coaxial cable is illustrated and will be described. More particularly, the coaxial cable voltage test indicator 10 has a coaxial cable connector 12, a green light emitting diode LED2 showing 13 VDC and a red light emitting diode LED1 showing 18 VDC.

In FIG. 2 a schematic of the coaxial cable voltage test indicator 10 comprising a coaxial cable connection 12, in this case an F type connector, electrically connected to a voltage monitor circuit IC1, in the preferred embodiment being a MAXIM ICL7665CPA, having a high voltage set point connection SET1, a low voltage set point connection SET2, a high voltage output OUT1 and a low voltage output OUT2. The voltage monitor circuit IC1 is electrically connected at connection V+ to the coaxial cable connection 12. The voltage monitor circuit IC1 is powered by the input from the coaxial cable connection 12. The voltage monitor circuit IC1 has a ground connection electrically connected to ground. A voltage divider network has a set of high voltage resistors R1 and R2, and a set of low voltage resistors R6 and R7. A first lead of resistors R1 and R2 is electrically connected to the high voltage set point connection SET1 that is set to 18 VDC. A second lead of resistor R2 is electrically connected to ground. A first lead of resistors R6 and R7 is electrically connected to the low voltage set point connection SET2 that is set to 13 VDC. A second lead of resistor R6 is electrically connected to ground. A second lead of resistor R7 is electrically connected to a second lead of resistor R1. A 5 volt voltage regulator IC2 has a ground connection, electrically connected to ground, a voltage input connection IN which is electrically connected to the junction of resistors R1 and R7, and a voltage output connection OUT1 that is electrically connected to a first lead of a ground capacitor C1 and coaxial cable connection 12. The combination of voltage monitor circuit IC1 and the voltage divider network R1, R2, R6 and R7 form a voltage discrimination circuit. Ground capacitor C1 has a second lead electrically connected to ground. A visual display is comprised of a green light emitting diode LED2 and a red light emitting diode LED1. The voltage monitor circuit IC1 high voltage output OUT1 is electrically connected to the base of an amplifier T1, in this case a 2N3906. The amplifier T1 has an emitter electrically connected to coaxial cable connection 12 and a collector electrically connected to a first lead of a current limit resistor R3. A second lead of R3 is electrically connected to an anode of the red light emitting diode LED1, a cathode of LED1 is electrically connected to ground. The voltage monitor circuit IC1 low voltage output OUT2 is electrically connected to the base of an amplifier T2, in this case a 2N3906. Amplifier T2 has an emitter electrically connected to coaxial cable connection 12 and has a collector electrically connected to a first lead of a current limit resistor R4. A second lead of R4 is electrically connected to an anode of the green light emitting diode LED2, a cathode of LED2 is electrically connected to ground.

In FIG. 2 a functional block diagram of the coaxial cable voltage test indicator 10 of the present invention is shown.

In use, it can now be understood that the coaxial cable voltage test indicator is connected to the receiver cable to the low noise block down-converter to indicate correct voltage. If the frequency is faulty between the receiver and the low noise block down-converter it will be shown on the LED readout. The device can also be used to test mast mounted VHF/UHF television pre-amplifiers.

While a preferred embodiment of the coaxial cable voltage test indicator has been described in detail, it should be apparent that modifications and variations thereto are possible, all of which fall within the true spirit and scope of the invention. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. For example, any type of coaxial cable system voltage and polarity could be checked with this system, which includes amateur radio, commercial or governmental radio, computer networks and the like, not just the digital satellite subscriber systems described.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A coaxial cable voltage test indicator comprising:

a coaxial cable connection;

a voltage monitor circuit for discriminating a plurality of voltage levels, said voltage monitor circuit being electrically connected to said coaxial cable connection, said voltage monitor circuit being powered by the input from said coaxial cable connection;

a visual display electrically connected to said voltage monitor circuit, said visual display being powered by the input from said coaxial cable connection, said visual display includes a plurality of light emitting diodes connected to said voltage monitor circuit;

a 13 volt direct current voltage level causes the lighting of a green light emitting diode of said visual display; and a 18 volt direct current voltage level causes the lighting of a red light emitting diode of said visual display.

2. A coaxial cable voltage test indicator comprising:

a coaxial cable connection;

a voltage monitor circuit having a plurality of voltage set points and a plurality of outputs complimentary to said voltage set points, said voltage monitor circuit being electrically connected to said coaxial cable connection, said voltage monitor circuit being powered by the input from said coaxial cable connection;

a visual display electrically connected to said voltage monitor circuit, said visual display being powered by the input from said coaxial cable connection;

a current limiting resistor having a first and a second lead;

a light emitting diode, having an anode connected to said second lead of said current limiting resistor; and an amplifier having a base connected to said voltage monitor circuit output; an emitter connected to said coaxial cable connection, and an amplifier emitter connected to said first lead of said current limiting resistor.

3. A coaxial cable voltage test indicator comprising:

a coaxial cable connection;

a voltage monitor circuit having a high voltage set point connection, a low voltage set point connection, a high voltage output, a low voltage output, a power connection and a ground connection, said voltage monitor circuit being electrically connected at said voltage monitor power connection to said coaxial cable connection, said voltage monitor circuit being powered by the input from said coaxial cable connection;

a first resistor having a first lead and a second lead, said first resistor first lead being electrically connected to said voltage monitor circuit high voltage set point connection;

a second resistor having a first lead and a second lead, said second resistor first lead being electrically connected to said voltage monitor circuit high voltage set point connection, said second resistor second lead being electrically connected to ground;

a sixth resistor having a first lead and a second lead, said sixth resistor first lead being electrically connected to said voltage monitor circuit low voltage set point connection, said sixth resistor second lead being electrically connected to ground;

a seventh resistor having a first lead and a second lead, said seventh resistor first lead being electrically connected to said voltage monitor circuit low voltage set point connection, said seventh resistor second lead being electrically connected to said first resistor second lead;

a voltage regulator circuit having a ground connection being electrically connected to ground, a voltage input connection which is electrically connected to the junction of said first resistor second lead and seventh resistor second lead, a voltage output connection being electrically connected to said coaxial cable connection;

a ground capacitor having a first lead electrically connected said coaxial cable connection and having a second lead electrically connected to ground;

a first amplifier having a base electrically connected to said voltage monitor circuit high voltage output, said first amplifier having an emitter electrically connected to said coaxial cable connection;

a third resistor having a first lead electrically connected to a collector of said first amplifier;

a red light emitting diode having a cathode electrically connected to ground, said red light emitting diode having an anode being electrically connected to a second lead of said third resistor;

a second amplifier having a base being electrically connected to said voltage monitor circuit low voltage output, said second amplifier having an emitter electrically connected to said coaxial cable connection;

a fourth resistor having a first lead electrically connected to a collector of said second amplifier; and a green light emitting diode having an anode electrically connected to a second lead of said fourth resistor, said green light emitting diode having a cathode electrically connected to ground.

4. The coaxial cable voltage test indicator of claim 3 wherein:

said voltage regulator regulates to five volts direct current.

5. The coaxial cable voltage test indicator of claim 3 wherein:

said first resistor and second resistor are chosen to trigger the voltage monitor circuit high voltage output at 18 volts direct current; and said sixth resistor and seventh resistor are chosen to trigger the voltage monitor circuit low voltage output at 13 volts direct current.

* * * * *